(12) United States Patent
Schulze et al.

(10) Patent No.: US 9,318,463 B2
(45) Date of Patent: Apr. 19, 2016

(54) METHOD FOR PRODUCING A PHOTOVOLTAIC MODULE

(71) Applicant: Fraunhofer-Gesellschaft zur Förderung der angewandten Forschung e.V., Munich (DE)

(72) Inventors: Stefan Schulze, Halle/Saale (DE); Matthias Schak, Halle/Salle (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/273,908

(22) Filed: May 9, 2014

(65) Prior Publication Data

US 2014/0335643 A1    Nov. 13, 2014

(30) Foreign Application Priority Data

May 13, 2013    (EP) ..................... 13167552

(51) Int. Cl.
*H01L 23/00*    (2006.01)
*H01L 31/05*    (2014.01)
(Continued)

(52) U.S. Cl.
CPC .............. *H01L 24/80* (2013.01); *H01L 31/049* (2014.12); *H01L 31/05* (2013.01); *H02S 40/34* (2014.12); *H01L 2924/12042* (2013.01); *Y02E 10/50* (2013.01)

(58) Field of Classification Search
CPC ........ H04L 24/80; H04L 31/05; H04L 31/049
See application file for complete search history.

(56) References Cited

U.S. PATENT DOCUMENTS

| | | |
|---|---|---|
| 3,559,769 A | 2/1971 | Arbeitlang |
| 4,384,163 A | 5/1983 | Rauschenbach et al. |
| 4,611,090 A | 9/1986 | Catella et al. |

(Continued)

FOREIGN PATENT DOCUMENTS

| | | |
|---|---|---|
| CN | 201667515 U | 12/2010 |
| CN | 201805378 U | 4/2011 |

(Continued)

OTHER PUBLICATIONS

Sproveri, John, "The Dish on Hot PLate Welding," Assembly, 2007 Jul. 19. pp. 1-8.*

(Continued)

*Primary Examiner* — Marc Armand
*Assistant Examiner* — Christina Sylvia
(74) *Attorney, Agent, or Firm* — Brinks Gilson & Lione

(57) ABSTRACT

A photovoltaic module having at least one photovoltaic cell may be produced. At least one photovoltaic cell may be arranged on a substrate, covering the substrate and the cell with at least one rear wall. The rear wall may be made from at least one back sheet material, connecting the substrate, the cell, and the rear wall to one another in a planar fashion. At least one component may be arranged on the rear wall of the photovoltaic module by welding to the back sheet material. In the welding process, a heating element may be positioned between the component and at least a partial area of the rear wall, and at least the partial area of the rear wall of the photovoltaic module and a partial area of the component may be brought into contact with respective surfaces of the heating element.

8 Claims, 7 Drawing Sheets

(51) Int. Cl.
*H02S 40/34* (2014.01)
*H01L 31/049* (2014.01)

(56) References Cited

U.S. PATENT DOCUMENTS

| | | | |
|---|---|---|---|
| 5,005,557 A * | 4/1991 | Bachli | C03C 17/09 |
| | | | 126/572 |
| 5,028,469 A | 7/1991 | Costard | |
| 5,707,459 A | 1/1998 | Itoyama et al. | |
| 6,370,828 B1 | 4/2002 | Genschorek | |
| 2003/0154667 A1 | 8/2003 | Dinwoodie | |
| 2004/0074205 A1 | 4/2004 | Stache | |
| 2005/0051204 A1 | 3/2005 | Oi et al. | |
| 2005/0224108 A1 | 10/2005 | Cheung | |
| 2008/0000174 A1 | 1/2008 | Flaherty et al. | |
| 2008/0041434 A1 | 2/2008 | Adriani et al. | |
| 2008/0149168 A1 | 6/2008 | Flaherty et al. | |
| 2009/0017292 A1 * | 1/2009 | Hieslmair | C23C 16/01 |
| | | | 428/336 |
| 2009/0188102 A1 * | 7/2009 | Lu et al. | 29/527.1 |
| 2009/0283136 A1 | 11/2009 | Münch et al. | |
| 2010/0258183 A1 | 10/2010 | Nattermann et al. | |
| 2010/0294528 A1 | 11/2010 | Sella et al. | |
| 2011/0000524 A1 | 1/2011 | Busch et al. | |
| 2011/0217856 A1 | 9/2011 | Vijh et al. | |
| 2011/0240088 A1 | 10/2011 | Ecob | |
| 2011/0272368 A1 | 11/2011 | Kufner | |
| 2012/0024373 A1 | 2/2012 | Dubbeldam | |
| 2012/0111407 A1 | 5/2012 | Rummens | |
| 2012/0152325 A1 | 6/2012 | Podkin et al. | |
| 2012/0167959 A1 | 7/2012 | Wirth et al. | |
| 2012/0174968 A1 | 7/2012 | Karg et al. | |
| 2013/0043055 A1 | 2/2013 | Ma et al. | |

FOREIGN PATENT DOCUMENTS

| | | |
|---|---|---|
| CN | 202050075 U | 11/2011 |
| CN | 202227625 U | 5/2012 |
| CN | 102544239 A | 7/2012 |
| DE | 2136 609 | 2/1973 |
| DE | 33 06 951 A1 | 9/1984 |
| DE | 40 28 937 A1 | 3/1992 |
| DE | 195 21 343 A1 | 12/1996 |
| DE | 20 2008 010 046 U1 | 1/2009 |
| DE | 20 2008 014 730 U1 | 2/2009 |
| DE | 20 2008 013 755 U1 | 4/2009 |
| DE | 10 2009 035 644 A1 | 2/2011 |
| DE | 10 2009 059 312 A1 | 6/2011 |
| DE | 20 2009 018 257 U1 | 6/2011 |
| DE | 10 2010 018 384 A1 | 10/2011 |
| DE | 10 2010 047 678 A1 | 4/2012 |
| DE | 10 2011 101 021 A1 | 5/2012 |
| DE | 10 2011 052 928 A1 | 8/2012 |
| DE | 10 2011 005 064 A1 | 9/2012 |
| DE | 20 2012 103 060 U1 | 10/2012 |
| DE | 10 2011 101 212 A1 | 11/2012 |
| EP | 2 190 030 A2 | 5/2010 |
| EP | 2 385 560 A2 | 11/2011 |
| EP | 2 511 624 A2 | 4/2012 |
| EP | 2 538 457 A2 | 12/2012 |
| GB | 2 193 465 A | 2/1988 |
| JP | 2004274088 A | 9/2004 |
| JP | 2005057008 A | 3/2005 |
| JP | 2012 204535 A1 | 10/2012 |
| WO | WO 2007124655 A1 | 11/2007 |
| WO | WO 2009040065 A2 | 4/2009 |
| WO | WO 2009/072760 A2 | 6/2009 |
| WO | WO 2009074135 A2 | 6/2009 |
| WO | WO 2010054998 A2 | 5/2010 |
| WO | WO 2010119950 A1 | 10/2010 |
| WO | WO 2011095304 A | 8/2011 |
| WO | WO 2011095485 A2 | 8/2011 |
| WO | WO 2011137898 A2 | 11/2011 |
| WO | WO 2012016732 A2 | 2/2012 |
| WO | WO 2012/128341 A1 | 9/2012 |
| WO | WO 2012119600 A2 | 9/2012 |
| WO | WO 2012167761 A1 | 12/2012 |
| WO | WO 2013/063071 A1 | 5/2013 |
| ZA | 9803208 | 10/1998 |

OTHER PUBLICATIONS

Lever, Lisa "Polymer Chemistry, The Glass transition, "University of South Carolina Upstate, Jul. 11, 2000.*

* cited by examiner

METHOD FOR PRODUCING A PHOTOVOLTAIC MODULE

CROSS-REFERENCE TO RELATED APPLICATIONS

This application claims priority from European application No. 13167552.2, filed May 13, 2013 which is incorporated herein by reference in its entirety.

BACKGROUND OF THE INVENTION

The invention relates generally to photovoltaic modules.

A photovoltaic module of the generic type is known from DE 20 2010 005 210 U1. This known photovoltaic module comprises a first plurality of photovoltaic cells and a second plurality of strip-like conductors. The photovoltaic cells and the strip-like conductors are arranged between a front-side protective plate made of glass and a rear wall made of plastic material or glass. A junction box, which is adapted to allow for a weather-proof cable connection of the photovoltaic module is disposed on the rear wall to lead away the electric energy generated by the photovoltaic cells. The junction box is applied to this known photovoltaic module by welding it on the rear wall of the photovoltaic module. To allow welding of the junction box, mounting straps are provided on the junction box.

This known photovoltaic module has the drawback that mounting of the junction box by means of mounting straps requires additional installation space on the rear wall of the photovoltaic module. Due to the large mounting surface of the mounting straps, welding also calls for a major energy input.

It is therefore an object of the invention to provide an economic method for producing a photovoltaic module having at least one junction box or at least one other component on its rear wall. Mounting said at least one junction box or at least one other component should be done rapidly and in cost-effective manner.

SUMMARY

In one embodiment, a method for producing a photovoltaic module is provided, where at least one photovoltaic cell provided with connecting contacts is applied to a substrate and then the substrate, the cell and at least one back sheet are connected to one another in a planar fashion, and where at least one component arranged on the rear wall of the photovoltaic module is welded to the back sheet According to the invention, a photovoltaic module is provided having at least one component on the rear wall thereof. In this context, said component may be in some of the embodiments of the invention a junction box for receiving a plug-in connector or a cable clamp to make a cable connection to the photovoltaic module, e.g. to connect the photovoltaic module to an inverter. In other embodiments of the invention, said component being arranged on the rear wall may comprise rear side reinforcing means being adapted to reduce or avoid bending of the photovoltaic module. Said rear side reinforcing means may comprise an elongated member having a T-shaped, an L-shaped or a rectangular or square cross-section. The cross-section may be hollow or solid in different embodiments of the invention. In still another embodiment of the invention, the component being arranged on the rear wall may be a frame which confines the photovoltaic module or being arranged adjacent to the edges of the photovoltaic module. In yet another embodiment of the invention, the component may comprise an electric cable, a cable holder or a mounting element by means of which the photovoltaic module may be attached to a façade, a roof or a support structure. In some embodiments of the invention, a plurality of components may be arranged on the rear wall of the photovoltaic module.

The photovoltaic module comprises at least one transparent or translucent substrate acting as a front-side protective plate and having a first side and an opposing second side. Furthermore, the photovoltaic module comprises at least one photovoltaic cell which may be made of monocrystalline or polycrystalline silicon, GaAs or $CuInGaSi_2$ in some embodiments. The photovoltaic cells are arranged on the first side of the substrate. The second side of the substrate or at least a part thereof usually will form a light entrance surface. The substrate may be adapted to protect the photovoltaic cells from atmospheric influences, such as oxygen, water, dust and other contamination. At least one rear wall which is connected to the substrate and the photovoltaic cells in a planar fashion seals the rear side of the photovoltaic module. This rear wall serves for preventing the access of oxygen, moisture, dust and other contamination to the photovoltaic cells and the strip-like conductors serving as interconnects in the interior of the photovoltaic module from the rear side.

The substrate may comprise a glass, quartz or a polymer material. In some embodiments of the invention, the substrate may comprise or consist of polycarbonate, polyethylene or polypropylene. The substrate is transparent or translucent, i.e. it has a low absorption in a spectral range being matched to the absorption band of the photovoltaic cells being used.

In some embodiments of the invention, the at least one rear wall may be formed from a back sheet material. Said back sheet may comprise at least one polymer or plastic material. In some embodiments of the invention, the plastic material may consist of or comprise a polyolefin. In some embodiments of the invention, the polyolefin may be selected from polyethylene and/or polypropylene. In other embodiments, the plastic material may comprise or consist of polyvinyl fluoride. In some embodiments of the invention, the back sheet may consist of or comprise a composite material made of a plurality of individual layers being fixed to each other. The individual layers may consist of identical materials or of different materials.

The rear wall may be connected to the photovoltaic cells and the substrate by hot melt adhesives or by heating under pressure, so as to join the back sheet material and the substrate by welding, thereby fixing the photovoltaic cells arranged therebetween.

In some embodiments of the invention, at least one further layer of material may be arranged between the substrate and the back sheet to achieve predefined optical properties, improve the adherence of the back sheet material to the substrate or electrically insulate and/or mechanically attach the photovoltaic cells. In some embodiments of the invention, such an intermediate layer may comprise or consist of ethylene vinyl acetate.

In some embodiments of the invention, joining the at least one component by welding on the rear wall of the photovoltaic module is done by placing the component, e.g. a junction box, at a certain distance above the partial area of the rear wall which is intended to accommodate said component. In some embodiments of the invention, a linear drive or an industrial robot may be used to carry out this method step automatically to ease a series production of photovoltaic modules according to the invention. In a second method step, a heating element is positioned between the component and the partial area of the rear wall of the photovoltaic module. By lowering the heating element to the rear wall of the photovoltaic module and by simultaneously positioning the component on the opposite side of the heating element, thermal energy may be introduced into the partial area of the photovoltaic module and into the contact surface of the component. Having sufficiently heated the component and/or the partial area of the photovoltaic module, the component may be lifted to remove the heating element. In the last step, the component is lowered again to come in contact with the partial area of the rear wall and letting the component and the rear wall cool to weld the parts together. The method according to this embodiment of the invention has the advantage that the component is connected to the photovoltaic module by means of a high-strength substance-to-substance bond so as to yield a better reliability and/or greater retention forces.

In some embodiments of the invention, the heating of the back sheet material and/or the component is carried out at least up to the glass transition temperature. Above the glass transition temperature, the molecules of the plastic material start moving, the physical bonding forces between the molecule chains drain away and the material of the component and/or the back sheet becomes soft. In the case of amorphous materials, the properties of the materials may change abruptly at the glass transition temperature. In some embodiments of the invention, the component and/or the back sheet material may be made of partially crystalline polymers which have an increased strength even above the glass transition temperature, thus the method may be carried out more easily.

In some embodiments of the invention, heating is carried out at least up to the melting temperature. Above the melting temperature, the crystal bonds of partially crystalline polymers break as well. As a result, the connection between the component and the back sheet may be improved. If this description calls for heating up to the glass transition temperature, this may also comprise a further heating up to the melting temperature or above in some embodiments of the invention.

In the next method step, the component and the partial area of the back sheet of the photovoltaic module being intended for mounting the component are joined by a predefined contact pressure. This feature allows cross-linking of the materials of the back sheet and the component. After having cooled down below the glass transition temperature, the component is permanently welded to the rear wall. The proposed method thus allows joining without additional adhesives which may have a reduced resistance to environmental influences, cause additional costs in the production of the photovoltaic module and require complex safety measures during processing on account of their solvent content. Since the at least one component may be welded to the back sheet material by means of its entire contact surface, additional mounting straps may be omitted without negatively affecting the adherence of the component.

As a result of the use of a single heating element, the method may be carried out efficiently and with a small mechanistic build-up, e.g. a single linear drive or a single industrial robot may be sufficient in some embodiments to introduce the heating element between the component and the photovoltaic element and remove it again prior to the final welding process.

In some embodiments of the invention, the method may be carried out with a first heating element which is adapted to heat the component to be welded or at least a subsurface of said component coming in contact with the rear wall of the photovoltaic module. Furthermore, a second heating element is provided being adapted to heat at least a partial area of the rear wall of the photovoltaic module, said partial area being intended for receiving the component. Both heating elements may be moved or positioned by related linear guides or industrial robots to contact the component and the photovoltaic module with the respective heating elements for a predefined time.

Having sufficiently heated both parts, the first heating element is removed from the component to be mounted and the second heating element is removed from the rear wall of the photovoltaic module such that the component can be positioned on the preheated partial area of the back sheet with a predefined contact pressure. When the component and the photovoltaic module have cooled down below the glass transition temperatures of the employed materials, the component is connected to the photovoltaic module permanently by means of a high-strength substance-to-substance bond. The use of two heating elements may have the advantage that temperature and contact time may be adapted to suit the needs of the materials of the component and the rear wall, and therefore both the component and the back sheet may be heated in optimum fashion without the risk of damaging one of the mating parts by excess heating.

In some embodiments of the invention, the first heating element may be arranged immovably, and only the component is moved by transporting means such as an industrial robot being adapted to bring the contact surface of the component initially into contact with the first heating element in order to heat the component for a predefined time and then to the rear wall of the photovoltaic module after heating the component for a predefined time.

The period of time required for the heating above the glass transition temperature may depend on the glass transition temperature, the thickness and the composition of the back sheet material and the material chosen for the component. In some embodiments of the invention, the period for heating the two parts may be selected from the range from about 2 sec and about 20 sec or the range from about 5 sec and about 10 sec.

In still another embodiment of the invention, the component may be placed on the back sheet of the photovoltaic module before it is heated. In this case, one mating part or both mating parts may have a temperature below the glass transition temperature. In some embodiments of the invention, both mating parts may be at room temperature when joined. In this case, the component may be positioned very accurately since it does not immediately connect to the back sheet and small corrections during the positioning process may be possible.

After positioning the component on the partial area of the back sheet of the photovoltaic module, a heat source may be contacted with the component and the back sheet to heat at least one mating part at least partially above the glass transition temperature. After removing the heat source, the component and the photovoltaic module cool down below the glass transition temperature, thereby forming a weld between both mating parts. As a heat source for melting the surface of at least one mating part, some embodiments of the invention may use a heating element which introduces thermal energy by heat conduction as a result of the direct contact with the component and/or the back sheet. In other embodiments of the invention, a coherent or incoherent radiation source may be used as a heat source, said radiation source introducing an electromagnetic radiation into the joining area of both mating parts so as to melt at least one surface. In some embodiments of the invention, the electromagnetic radiation may be selected in the infrared spectral range. In some embodiments, the wavelength of the electromagnetic radiation may be selected from the range of about 50 μm and about 1 μm or from the range of about 20 μm and about 2 μm or from the range of about 5 μm and about 3 μm.

In some embodiments of the invention, the heating element may have a second side having a shape so as to be complementary to the partial area of the photovoltaic module being intended to receive said component. The heating element may have a first side having a shape so as to be complementary to the mounting area or mounting surface of the component. If the rear wall of the photovoltaic module is made as a largely flat area, the heating element may also have two flat areas so as to yield a disk-shaped heating element. If the form of the rear wall of the photovoltaic module has a more complex form, e.g. a spherical surface or an aspherical curved surface, the heating element may have a surface which is shaped so as to be complementary thereto, and therefore the heating element may easily contact the partial area of the component and the partial area of the rear wall of the photovoltaic module all-over to ensure a reliable heat transfer.

In some embodiments of the invention, the heating element may be adapted to allow the first side and the second side having different temperatures when the heating element is operated. As a result, the heat transfer to the comparatively thin back sheet material of the photovoltaic module may be smaller than the heat input into the component to be welded so as to heat both mating parts up to the glass transition temperature with equal contact time and avoid heat damage to any of the mating parts.

In some embodiments of the invention, the heating element may have a second side which is shaped so as to be complementary to the shape of the partial area of the rear wall of the photovoltaic module, and may also have a recess which is made to receive at least a partial volume of the component. Such a heating element allows the heating of not only the direct contact surface of the component up to the glass transition temperature but also adjoining side walls. As a result, it is possible to reduce the heat loss via the side walls and/or to produce a relatively large welding area and thus a more stable welding by heating up the side walls.

In some embodiments of the invention, the heating element may be annular. An annular heating element may have a round or polygonal cross-sectional area. The annular heating element may enclose a recess, the cross-section of which may be shaped so as to be complementary to the cross-section of the component. In this case, the component may be placed on the photovoltaic element with a temperature below the glass transition temperature before the heating element is put on to heat the joint above the glass transition temperature by heat conduction or thermal radiation.

In some embodiments of the invention, the heating elements may be heated by induction heating and/or by resistance heating. This allows a reliable heating of the heating elements, a simple electronic feedback control of the operating temperature and the avoidance of combustion residues which may occur when liquid or gaseous fuels are used for heating.

In some embodiments of the invention, at least the contact surfaces of the heating element and/or of the first heating element and/or of the second heating element may be provided with a coating to prevent the plastic material of the back sheet and/or of the component from adhering.

If the welding process is carried out by absorbing an electromagnetic radiation at the joint of the mating parts, a radiation-absorbing dye may be added between the component and the partial area of the rear wall of the photovoltaic module. In some embodiments, the dye may be added during the production of any of the component and/or the back sheet of the plastic material, and therefore the components may be adapted to absorb the electromagnetic radiation provided for welding preferably at the joint. In other embodiments of the invention, the dye may be applied by spreading, printing techniques, coating with wiper or spraying at least one contact surface of at least one mating part. In some embodiments, nigrosine or carbon black may be used as a radiation-absorbing dye.

In some embodiments of the invention, the electromagnetic radiation used for welding may be coherent radiation. In some embodiments of the invention, such a coherent radiation may be provided by a diode laser and/or a $CO_2$ laser. This allows a simple control of the radiation source through electric signals, a good focusing on the joint and, on account of large radiation intensities, a rapid welding process having short cycle times.

The welding process according to the invention may preferably be carried out when the component and/or the back sheet material consist of or comprise a thermoplastic material.

These and other aspects of the invention are described further below with reference to the figures.

DETAILED DESCRIPTION OF THE INVENTION

Figure 1:
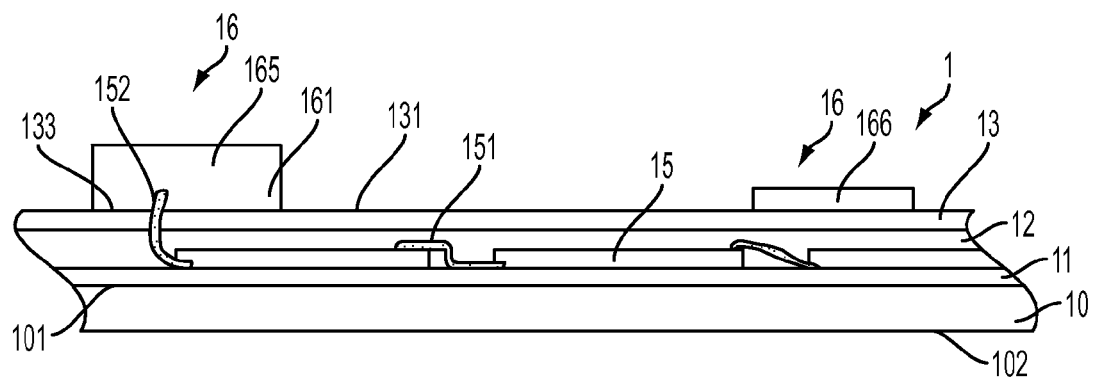
FIG. 1 illustrates a cross-section through a photovoltaic module.

FIG. 1 shows a cross-sectional view through a photovoltaic module 1 according to the present invention. FIG. 1 illustrates a substrate 10. The substrate 10 may be transparent or translucent, at least in partial areas, to enable the penetration of solar radiation. Thus, the substrate may act as a front-side protective plate. In some embodiments of the invention, the substrate 10 may be made from glass, quartz or a plastic material. If the substrate 10 comprises a plastic material, the latter may be selected from a polyolefin, polyethylene, polycarbonate or polypropylene. The substrate 10 may be electrically insulating.

The substrate 10 has a light entry surface 102. The light entry surface 102 may be coated, e.g. to reduce reflections or to avoid premature aging of the substrate due to influences of weather.

An optional first embedding film 11 may be arranged on the side 101 opposite to the light entry surface 102. The embedding film 11 may comprise or consist of polyvinyl acetate and/or ethylene vinyl acetate, for example. In other embodiments of the invention, the embedding film 11 may also be omitted. An embedding film 11 may consist of a laminate having a plurality of individual layers. The embedding film 11 may be elastic to avoid mechanical stress peaks on the photovoltaic cells 15.

At least one photovoltaic cell 15 is arranged on the optional embedding film 11 or directly on the substrate 10. If a plurality of photovoltaic cells 15 is present in the photovoltaic module 1, the former may be coupled in series and/or parallel by strip-like conductors 151. The strip-like conductors 151 may be attached to the photovoltaic cells by soldering or welding. The respectively last cell of a plurality of serially coupled photovoltaic cells 15 may have an electrical contact 152 which is connected to a screw terminal or a plug-in connector to enable the connection of a cable to the photovoltaic module.

An optional second embedding film 12 may be arranged on the photovoltaic cells 15. The second embedding film 12 may guarantee the mechanical fixation of the photovoltaic cells 15 together with the first embedding film 11, and therefore the photovoltaic cells may reliably maintain their position between the substrate 10 and the rear wall even if the photovoltaic module 1 is mounted on an inclined roof or is exposed to vibrations during transportation or operation. In addition, the first embedding film 11 and the second embedding film 12 may be made from an electrically insulating material such as polyvinylnalacetat to avoid a short circuit or the bypassing of individual photovoltaic cells 15.

A back sheet material 12 is applied as a rear wall to form a protection from weather. In some embodiments of the invention, the back sheet material 12 may be a laminate of a plurality of layers. As a result, the different demands made on the outer side 131 and on the inner side facing the second embedding film 12 may be easily complied with. For example, the inner side shall have a high adhesive strength and have a large degree of reflection. On the other hand, the task of the outer side 131 predominantly consists in a protection from weather, i.e. the penetration of moisture or dust shall be avoided, to extend the service life of the photovoltaic module 1.

In some embodiments of the invention, the back sheet material 13 may comprise a polyethylene layer between two polyvinyl fluoride layers. In other embodiments of the invention, different polyamides may be adhered or laminated to one another to form a back sheet 13.

The substrate 10, the embedding films 11 and 12, the photovoltaic cells 15 and the back sheet 13 may be permanently connected to one another by all-over adhering or laminating or welding so as to protect the photovoltaic cells 15 from the influences of weather and obtain a mechanically stable photovoltaic module 1 which is easy to handle and has a long service life.

At least one component 16 may be arranged on the rear wall 131 of the photovoltaic module 1. The illustrated exemplary embodiment shows a junction box 165 which receives the connecting contact 152, and so that a cable connection may be made which is protected from influences of weather. Furthermore, FIG. 1 shows by way of example rear side reinforcing means 166 in the form of a rectangular profile which may improve the mechanical stability of the photovoltaic module 1. In addition, further components 16 may be present, e.g. electric connection cables, cable ducts, frame components or further parts which are not specified herein. The following FIGS. 2 to 5 describe aspects of the method for welding these components to the rear side of the photovoltaic module exemplarily on a junction box 165. However, this shall by no means be interpreted to be limiting. Other components 16 may likewise be welded to the rear wall 131 of the photovoltaic module 1.

For the substance-to-substance bonding of the component 16, a partial area 161 of the component 16 facing the photovoltaic module 1 is welded to a partial area 133 of the back sheet material of the rear wall 13. The welding process is carried out by heating the partial area 161 and/or the partial area 133 above the glass transition temperature while both mating parts are in contact with each other. As a result, cross-linkage or partial mixing of the polymers of both mating parts occurs so as to produce a stable bond at the joint 161, 133 after cooling down below to the glass transition temperature.

Figure 2:
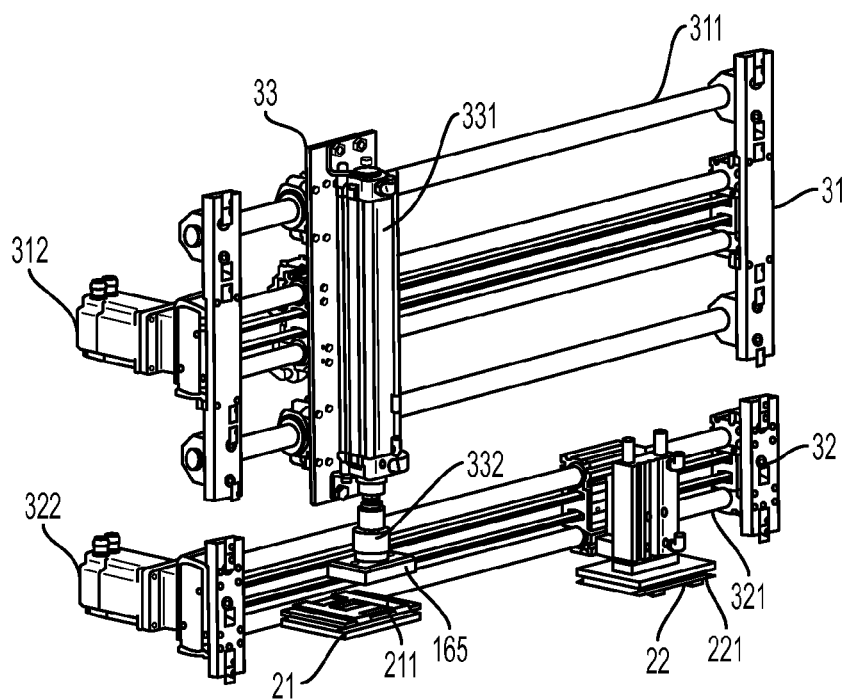
FIG. 2 illustrates an apparatus according to a second embodiment of the invention.

FIG. 2 shows a second variant of the method according to the invention. FIG. 1 shows a first linear drive 31 which comprises a carriage 33 on guide rails 311. The carriage 33 may be moved along the guide rails 311 by drive means 312. A further linear drive 331 is located on the guide carriage 33, and a gripper 332 is arranged on the end of the linear drive. The griper 322 is adapted to receive a junction box 165 and/or any other component 16 which is supplied to the apparatus, e.g. by means of a conveyor belt or from a storage box.

Furthermore, the apparatus has a first heating element 21, which has a heated first side 211. The first side 211 of the heating element 21 is shaped so as to be complementary to the partial area 161 of the junction box 16. The partial area 161 of the junction box 165 may be contacted with the first side 211 of the first heating element 21 by driving the linear guides 31 and 33. As a result, the junction box 165 is heated at least partially above the glass transition temperature.

In addition, a second linear guide 32 is available. The second linear guide 32 is also movable by drive means 322. A second heating element 22 which is attached to the second linear guide 32 may be moved by driving the drive means, e.g. by a microprocessor, a microcontroller or a stored-program controller. The second heating element 22 has a second side 221 which is shaped so as to be complementary to the partial area 133 of the photovoltaic module 1. The photovoltaic module 1 is moved into the working area of the second linear guide 32 by conveying means (not shown) so as to bring the second heating element 22 in contact with the rear wall 131 of the photovoltaic module 1 in the partial area 133. As a result, a partial area 133 of the rear wall 131 is heated to a temperature above the glass transition temperature.

After heating both mating parts sufficiently, the second heating device 22 may be removed from the partial area 133 of the rear wall by means of the linear guide 32. The junction box 165 is removed from the first heating element 21 below by driving the linear guides 31 and 33 and is placed on the partial area 133 of the rear wall 131 of the photovoltaic module 1 by means of a predefined contact pressure. After having cooled down below the glass transition temperature, the junction box 165 is permanently and reliably connected to the photovoltaic module 1.

Figure 3:
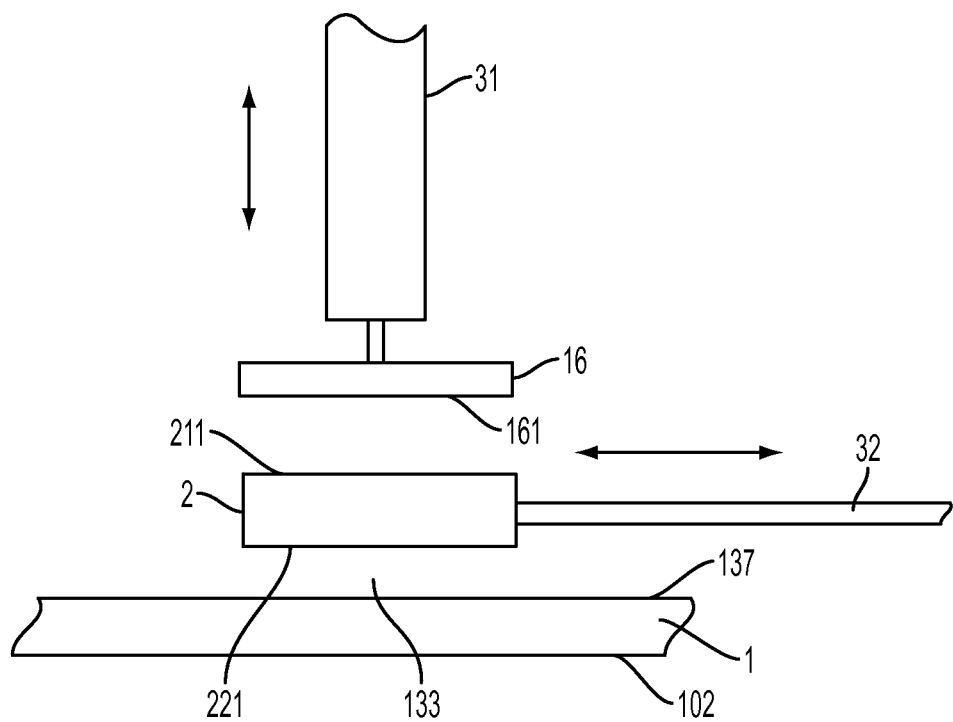
FIG. 3 illustrates an apparatus according to a first embodiment of the invention.

FIG. 3 shows a first variant of an apparatus for carrying out the proposed method. Like elements of the invention are provided with like reference signs, and therefore the following description is limited to the differences.

FIG. 3 also shows a section from the cross-section of a photovoltaic module 1 with a front side or light entry surface 102 and rear wall 131. A component 16, e.g. a junction box, shall be attached to a partial area 133 of the rear wall 131.

A heating element 2 serves for heating the back sheet of the photovoltaic module 1 and the component 16 above the glass transition temperature. The heating element 2 has a first side 211 which is shaped so as to be complementary to the contact surface of the component 16. Furthermore, the heating element 2 has an opposing second side 221 which is shaped so as to be complementary to the partial area 133 of the photovoltaic module 1. In the simplest case, i.e. when the rear wall 131 of the photovoltaic module 1 is flat, the first side 211 and the second side 221 of the heating element 2 are also flat.

The heating element 2 is heated to a predefined temperature to enable sufficient heating depending on the material thickness and the material quality of the back sheet material of the rear wall 131 and the component 13 in a predefined period of time. In some embodiments of the invention, the temperature of the first side 211 and the second side 221 may be chosen so as to be different. This may be done e.g. by arranging a resistance heater being part of the heating element 2 more closely to one side or partially shielding at least one side at least partly by means of a heat insulating layer from the thermal flow of a resistance heater or arranging a heat insulating layer in the center of the cross-section of the heating element 2 and arranging resistance heaters on both sides, each resistance heater predominantly heating one side 211 or 221.

In order to carry out the welding process, the component 16 is positioned by means of a first linear guide 31 above the partial area 133 of the rear wall 131 and at a distance above the rear wall 131. The heating element 2 is positioned between the component 16 and the rear wall 131 by means of a second linear guide 32. By lowering the component 16, both the partial area 133 of the rear wall 131 of the photovoltaic module 1 and the contact surface 161 of the component 16 come into contact with the heating element 2.

After sufficient heating, the contact pressure is reduced via the linear guide 31, and subsequently the heating element 2 may be removed. On account of lowering of the component 16 to the photovoltaic module 1 again, the component 16 is joined with a predefined contact pressure to the partial area 133. After cooling down below the glass transition temperature, the linear guide 31 may be removed and the component 16 is permanently connected to the photovoltaic module 1 by a weld.

Figure 4:
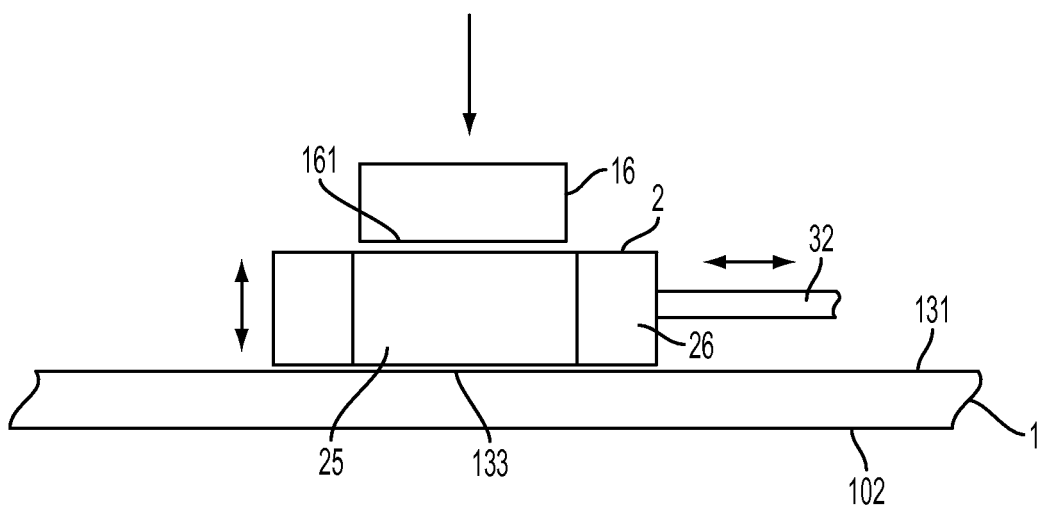
FIG. 4 illustrates an apparatus according to a third embodiment of the invention.

FIG. 4 details aspect of an apparatus for carrying out a third process variant according to the invention. Like elements of the invention are provided with like reference signs and therefore the following description is limited to the differences.

FIG. 4 shows a section of a photovoltaic module 1. According to the third process variant, a component 16, e.g. a junction box, shall be welded with its contact surface 161 on a partial area 133 of the rear wall 131 of the photovoltaic module 1. For this purpose, the component 16 may be moved by means of a linear guide (not shown) along the illustrated arrow until the contact surface 161 contacts the rear wall 131 of the photovoltaic module 1.

In the next method step, an annular heating element 2 may be advanced to the joint by means of a second linear guide 32 in such a way that the component 16 is received in an associated recess 25 of the heating element 2. The recess 25 may be surrounded by annular heating elements 26 so as to introduce heat at least into a partial area of the contact surface 161 of component 16 and the partial area 133 of the rear wall 131. This heat flow may heat the mating parts above the glass transition temperature. Then, the heating element 2 is removed from the joint, and therefore the temperature drops below the glass transition temperature again and the component 16 is permanently welded to the rear wall 131.

In a variant of the process, the heating element 2 may be initially positioned with its recess 25 above the partial area 133 before the component 16 is introduced into the recess 25 from above. As a result, the heat input in the rear wall 131 may be increased when preheating the partial area 133 of the rear wall 131 without the component being present.

In still another alternative embodiment of the method according to the third variant, the component 16 may initially be introduced into the recess 25, and therefore a heat flow of the heating element 2 warms up at least a part of component 16. Then, the heating element 2 may be lowered together with the component 16 onto the rear wall 131. In this case, the total heat flow into the component 16 is higher than the total heat flow into the rear wall 131 due to the extended exposure time of the component 16 to the heating device 2. This may be in particular useful if the component 16 has an increased thermal capacity compared to the rear wall 131, e.g. due to higher layer thicknesses.

Figure 5:
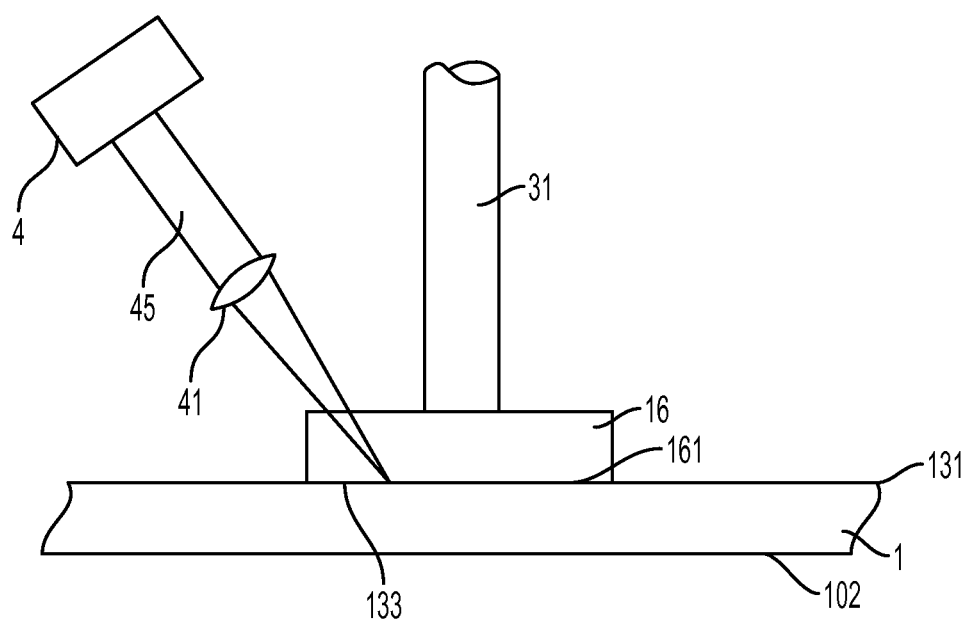
FIG. 5 illustrates an apparatus according to a fourth embodiment of the invention.

FIG. 5 shows a fourth embodiment of the method and an apparatus usable for this purpose. FIG. 5 shows a section of a photovoltaic module 1 with a rear wall 131, where a component 16 abuts against a partial area 133 via a contact surface 161. According to the illustrated embodiment, the component 16 shall be positioned with a linear guide 31 on the rear wall 131. Then, an electromagnetic radiation 45 acts on the partial area 133 and/or the contact surface 161 to locally heat at least one surface above the glass transition temperature. For this purpose, the electromagnetic radiation 45 may be selected from the infrared spectral range and may have a wavelength selected from about 50 μm to about 1 μm.

In some embodiments, the electromagnetic radiation 45 may be focused by an optional lens 41, and therefore the electromagnetic radiation 45 may penetrate the component 16 with little intensity so that the maximum energy is deposited directly at the joint of the surfaces 133 and 161. The electromagnetic radiation 45 may be coherent or incoherent. In some embodiments of the invention, e.g. a $CO_2$ laser or a diode laser may be used as a radiation source 4 of coherent radiation.

In order to focus the absorption of the electromagnetic radiation 45 to the joint, a radiation-absorbing dye may be introduced or applied to the partial area 133 and/or the contact surface 161. For this purpose, the dye may be applied to the contact point by printing, spraying or coating with a wipe or may be embedded in the plastic material when the back sheet of the photovoltaic module 1 and/or the component 16 is produced.

Figure 6:
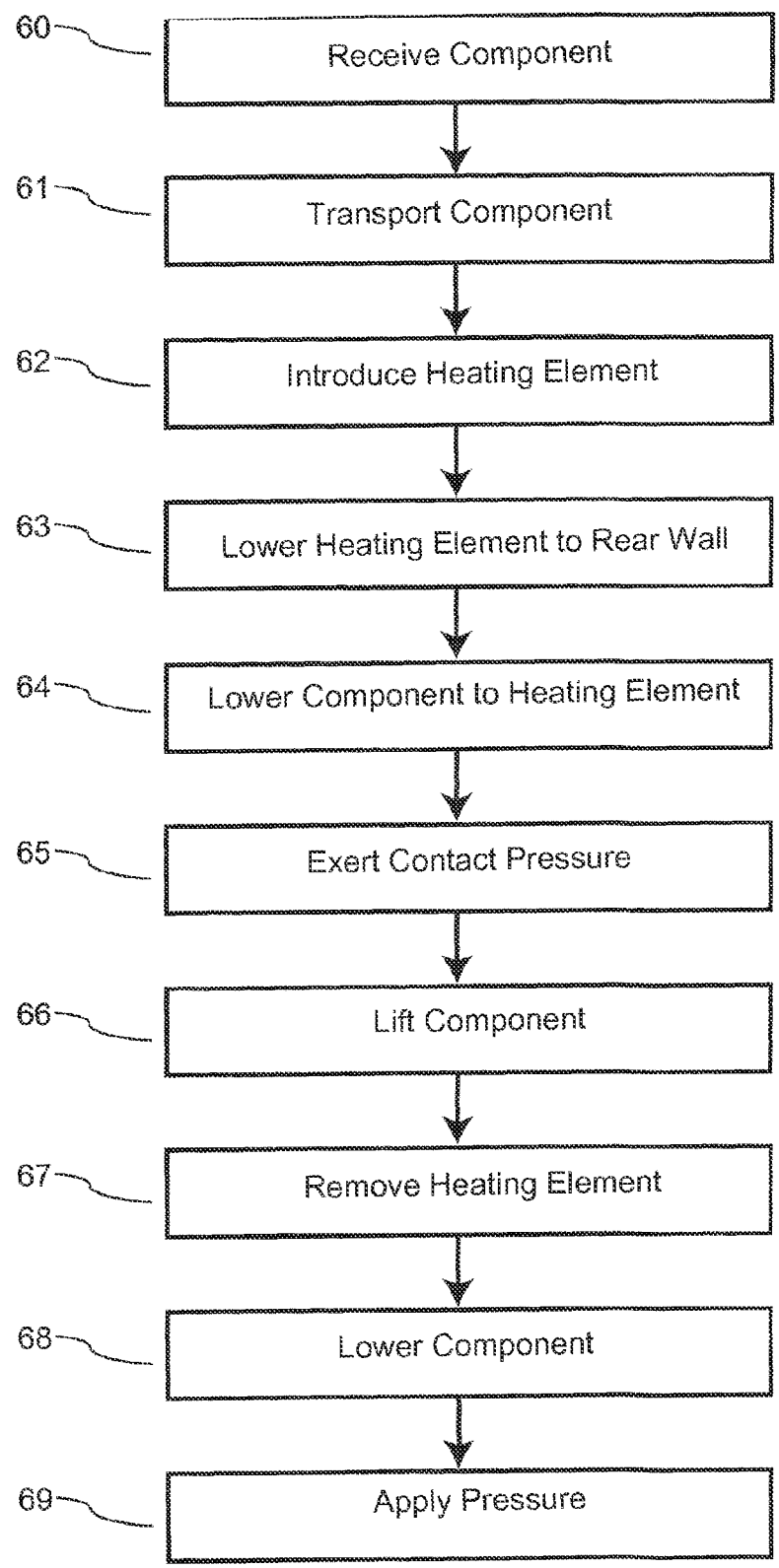
FIG. 6 illustrates a flow diagram which illustrates a first embodiment of a welding method.

FIG. 6 explains once again a first embodiment of the method according to the invention by means of a flow diagram. In the first method step 60, the component, e.g. a cable guide, a junction box or a rear wall reinforcing member, is received by a linear guide or an industrial robot.

In the second method step 61, the component 16 is transported above the partial area 133 being intended to receive the component 16 at the photovoltaic module 1.

In the third method step 62, the heating element 2 is then introduced between the component 16 and the photovoltaic module 1 or the rear wall 131 thereof respectively.

Finally, the heating element is lowered to the rear wall 131 of the photovoltaic module in the fourth method step 63. This will result in heating the partial area 133 of the rear wall 131 being in contact with the heating element.

In the directly following fifth method step 64, the component 16 is also lowered to the heating element. This will result in heating the contact area 161 of the component 16 being in contact with the heating element.

In the sixth method step 65, the contact pressure is exerted on the component, the heating element and the photovoltaic module by means of the linear guide or the industrial robot so as to produce a sufficient heat transfer from the heating element to the components to be joined. Thus, contact area 161 and partial area 133 may be heated simultaneously.

In the seventh method step 66, the component 16 is lifted so as to also reduce the contact force to the heating element. This method step is carried out when any of the contact area 161 and the partial area 133 reached at least the glass transition temperature.

Then, the heating element may be removed from the surface of the photovoltaic module 1 in the eighth method step 67 by means of its respective linear drive.

In the ninth method step 68, the component 16 is lowered again to contact the heated partial area 133 at the photovoltaic module 1.

In the tenth method step 69, a predefined pressure is finally applied to carry out the welding process. When the photovoltaic module 1 and the component 16 have cooled down, the method is concluded and the component 16 is permanently fixed to the photovoltaic module 1.

Figure 7:
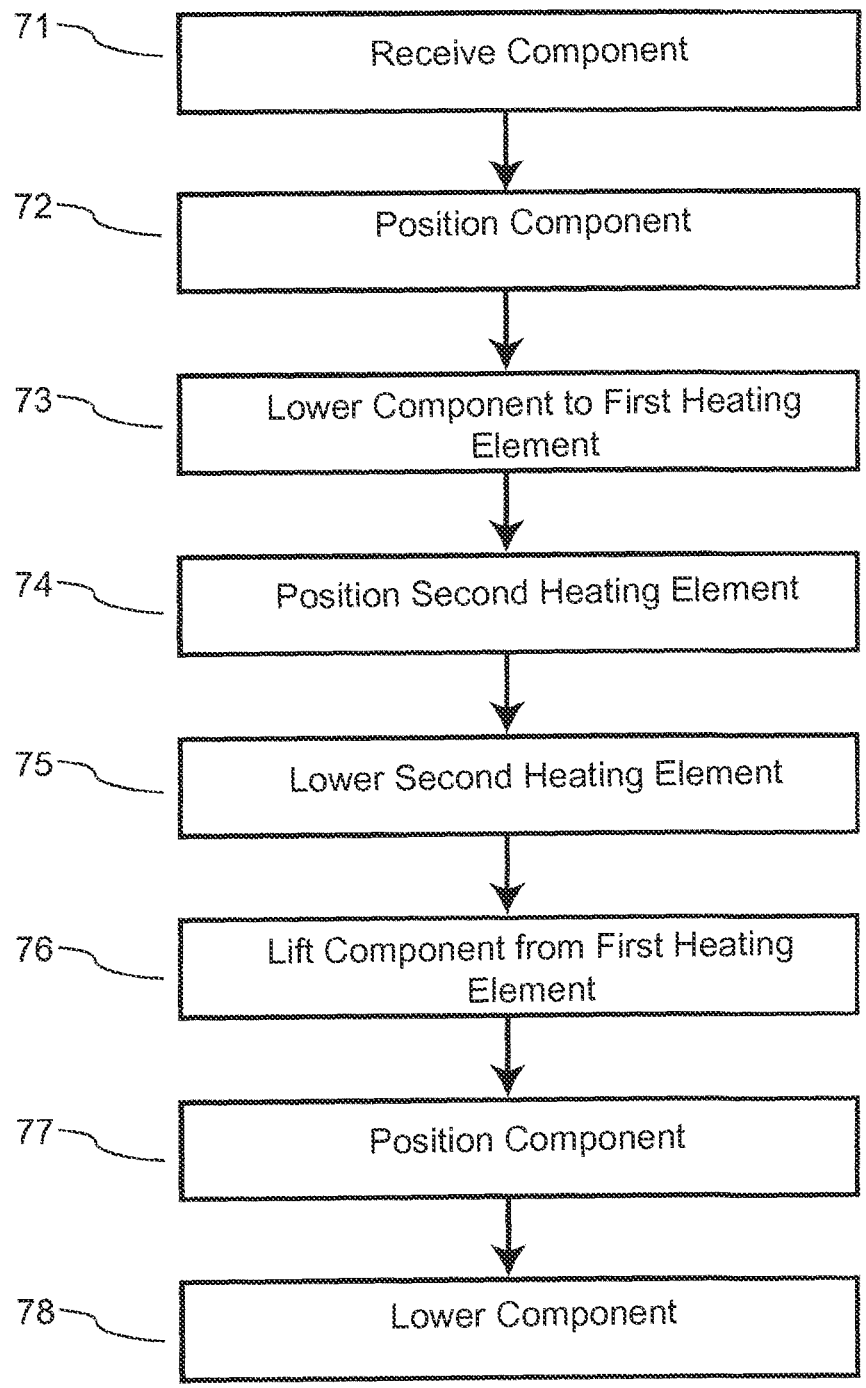
FIG. 7 illustrates a flow diagram which illustrates a second embodiment of a welding method.

FIG. 7 explains a second embodiment of the method according to the invention by means of a flow diagram.

In the first method step 71, the component 16 is received by an industrial robot or a linear guide.

In the second method step 72, the component 16 is positioned above a fixedly mounted first heating element.

Then, the component 16 is lowered to the first heating element in the third method step 73, where a predefined contact pressure is exerted on the heating element to enable a heat transfer at least to the contact surface 161 of the component 16.

In the fifth method step 74, a second heating element is positioned on the partial area 133 of the rear wall 131 of the photovoltaic module 1 by means of a linear guide or other drive means. Furthermore, the fifth method step 75 comprises the lowering and pressing-on of the second heating element, and therefore at least the partial area 133 is heated. This fifth method step may be carried out previously, simultaneously or subsequently to the first, second and third method steps.

In the sixth method step 76, the component is lifted from the first heating element. Furthermore, the second heating element is also lifted from the rear wall 131 after a sufficient exposure time.

In the seventh method step 77, the component is positioned above the photovoltaic module 1 by the linear guide.

In the subsequent eighth method step, the welding process is concluded by lowering the component 16, pressing it onto the partial area 131 with a predefined applied pressure and holding this connection until the mating parts having cooled down sufficiently, i.e. below the glass transition temperature.

Figure 8:
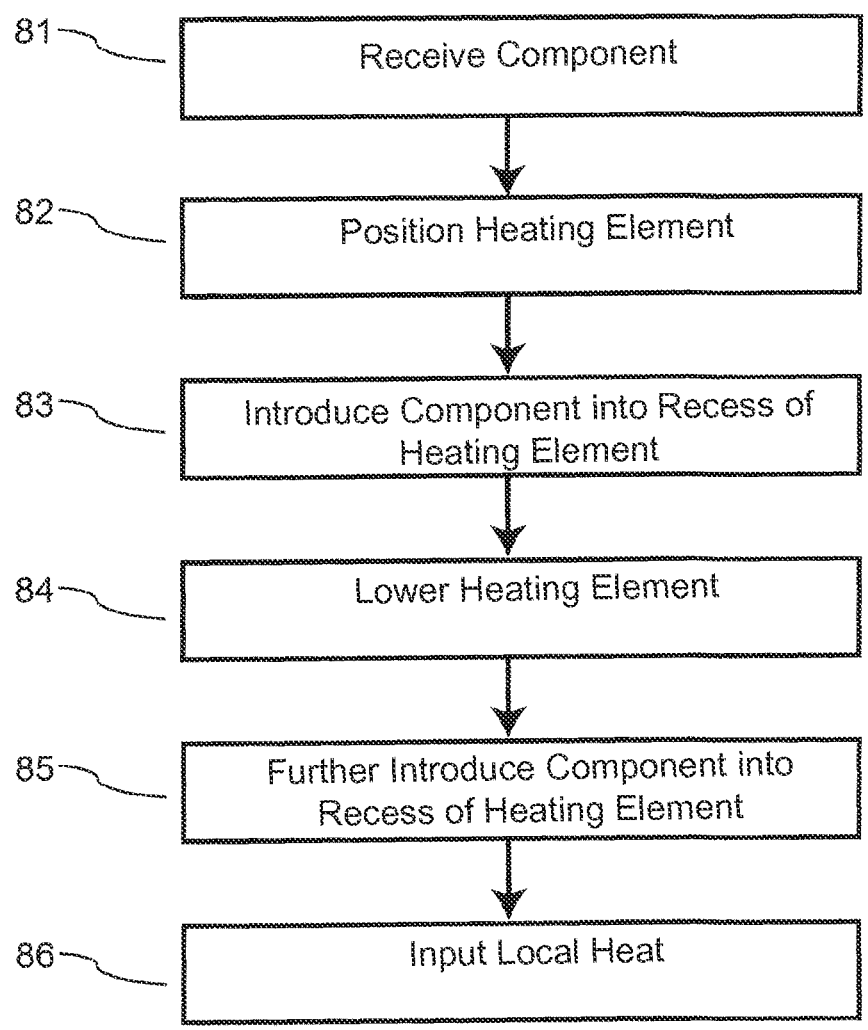
FIG. 8 illustrates a flow diagram which illustrates a third embodiment of a welding method.

FIG. 8 explains a third embodiment of the method according to the invention by means of a flow diagram.

A component 16 is received in the first method step 81 by an industrial robot or other component handling means.

In the second method step 82, an annular heating element is positioned above the rear wall 131 of the photovoltaic module 1 by a linear guide or other suitable drive means.

In the third method step 83, the component 16 is introduced into a recess of the annular heating element. The component 16 may then optionally be kept inside the heating element for a predefined period of time to achieve a pre-heating of the contact surface 161 of the component 16.

In the fourth method step 84, the heating element is lowered to the partial area 133 of the photovoltaic module 1. Thus, at least the partial area 133 is heated.

The fifth method step 85, in which the component 16 is further introduced into the recess 25 of the annular heating element 2, is carried out immediately or with a certain delay after the fourth method step. After having carried out the fifth method step, the component 16 abuts against the rear wall 131.

In the sixth method step 86, there is a local heat input into the contact area between the photovoltaic module 1 and the component 16. In the seventh method step (not shown), the heating element is removed and the applied pressure between the mating parts is eliminated after cooling down the components sufficiently.

Figure 9:
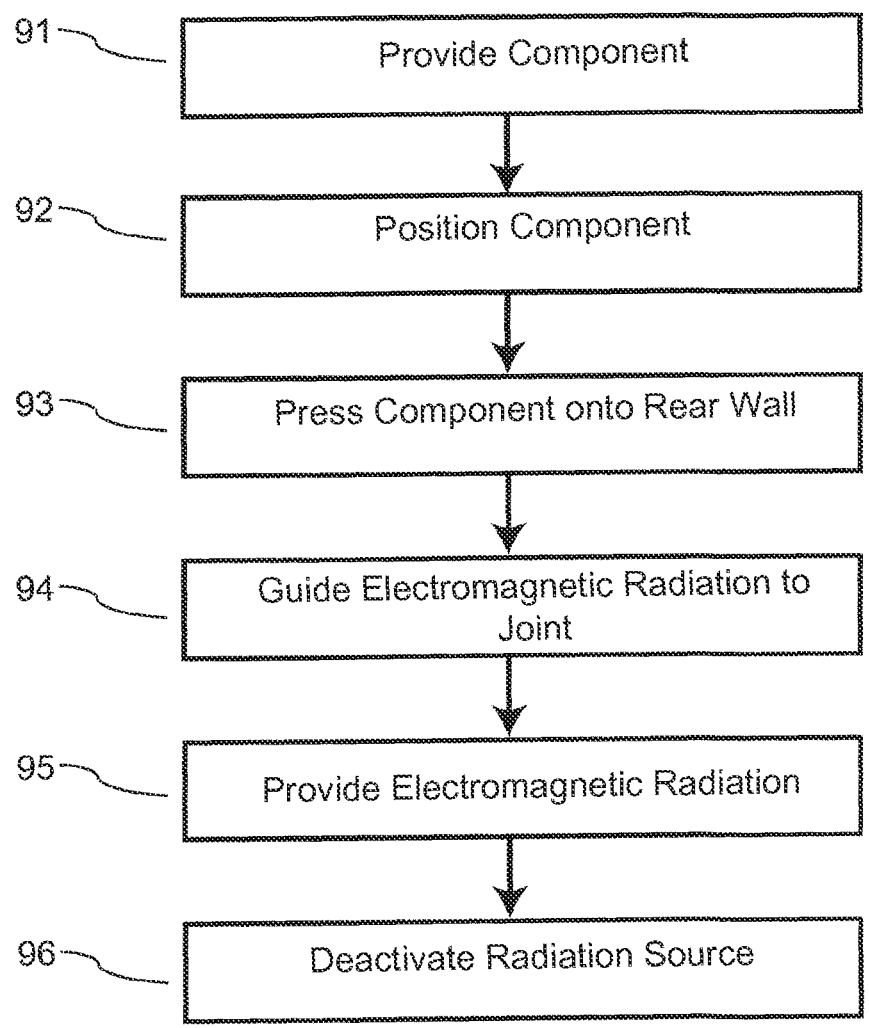
FIG. 9 illustrates a flow diagram which illustrates a fourth embodiment of a welding method.

FIG. 9 explains a fourth embodiment of the method according to the invention by means of a flow diagram.

The first method step 91 according to the fourth embodiment also comprises providing a component 16.

In the second method step 92, the component 16 is positioned above the partial area 133 of the photovoltaic module 1 by a linear guide or by other transport means having equal effects.

In the third method step 93, the component 16 is lowered and pressed onto the rear wall of the photovoltaic module by a predefined contact pressure.

In the subsequent fourth method step 94, electromagnetic radiation of a radiation source is guided to the joint by means of a robot arm. In some embodiments of the invention, a laser may be moved to the welded joint in the fourth method step 94, said laser being fixed to a robot arm.

In the fifth method step 95, the actual welding process starts by providing an electromagnetic radiation which is absorbed at least partly at the joint to achieve a sufficient heating of at least one mating part. For this purpose, the radiation source is activated, where the produced electromagnetic radiation is guided to predefined points or surface areas of the joint by moving the radiation source or guiding the beam. For example, the radiation source may rotate along the circumference of a circular component or be moved along the longitudinal extension of an elongate component. The heat input may be made into the surface of a mating part or into both mating parts, and therefore only one mating part melts directly or both mating parts melt.

In the sixth method step 96, the radiation source is deactivated and the contact pressure between the component and the photovoltaic module is maintained up to the complete solidification of the joint.

It will be appreciated by those skilled in the art that any number of combinations of the aforementioned features and/or those shown in the appended drawings provide clear advantages over the prior art and are therefore within the scope of the invention described herein. Therefore, the above description should not be considered limiting but explanatory. The below claims should be comprehended in such a way that a feature mentioned is present in at least one embodiment of the invention. This does exclude the presence of further features. If the claims and the above description define "first" and "second" features, this term serves for distinguishing two similar features, without determining any precedence.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

We claim:

1. A method for producing a photovoltaic module having at least one photovoltaic cell, said photovoltaic cell comprising connecting contacts, said method comprising the following steps:

arranging at least one photovoltaic cell on a substrate,
covering the substrate and the cell with at least one rear wall, said rear wall being made from at least one back sheet material,
connecting the substrate, the cell, and the rear wall to one another in a planar fashion, and
arranging at least one component on the rear wall of the photovoltaic module by welding to the back sheet material, wherein the welding process comprises the following steps:
receiving the component by positioning means,
positioning the component on a first heating element,
positioning a second heating element on a partial area of the rear wall of the photovoltaic module, said partial area being intended to receive said component,
introducing thermal energy into the partial area of the rear wall of the photovoltaic module and a partial area of the component to heat above the glass transition temperature,
joining the component and the partial area intended to receive said component by a predefined contact pressure, and
allowing the component and the photovoltaic module cool below the glass transition temperature in order to form a weld.

2. The method according to claim 1, wherein the second heating element comprises at least one surface which is shaped to as to be complementary to the partial area of the rear wall of the photovoltaic module, said partial area being intended to receive said component.

3. The method according to claim 1, wherein the first heating element comprises a first side which is shaped so as to be complementary to the partial area of the component.

4. The method according to claim 1, wherein the first heating element is immovable.

5. The method according to claims 1, wherein any of the first heating element and/or the second heating element is heated by any of induction heating and/or resistance heating.

6. The method according to claim 1, wherein any of the component and/or at least one heating element is moved by means of a linear drive.

7. The method according to claim 1, wherein the component consists of or comprises a thermoplastic material.

8. The method according to claim 1, wherein the component and/or the back sheet material comprises a partially crystalline plastic material.

* * * * *